(12) United States Patent
Chang et al.

(10) Patent No.: US 7,768,028 B2
(45) Date of Patent: Aug. 3, 2010

(54) LIGHT EMITTING APPARATUS

(75) Inventors: Sean Chang, Taoyuan Hsien (TW); Chao-Sen Chang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 181 days.

(21) Appl. No.: 11/790,433

(22) Filed: Apr. 25, 2007

(65) Prior Publication Data
US 2007/0252157 A1 Nov. 1, 2007

(30) Foreign Application Priority Data
Apr. 28, 2006 (TW) .............................. 95115254 A

(51) Int. Cl.
*H01L 33/00* (2010.01)
(52) U.S. Cl. .......................................... 257/99; 257/98
(58) Field of Classification Search .................. 257/40, 257/98, E25.02, 13, 79, 99, 100, E33.055–E33.059
See application file for complete search history.

(56) References Cited

U.S. PATENT DOCUMENTS

| | | | |
|---|---|---|---|
| 4,935,665 A * | 6/1990 | Murata | 257/E25.02 |
| 6,930,332 B2 * | 8/2005 | Hashimoto et al. | 257/98 |
| 7,070,304 B2 * | 7/2006 | Imai | 362/267 |
| 7,183,587 B2 * | 2/2007 | Negley et al. | 257/98 |
| 7,301,175 B2 * | 11/2007 | Izuno et al. | 257/98 |
| 7,329,907 B2 * | 2/2008 | Pang et al. | 257/99 |
| 7,329,942 B2 * | 2/2008 | Tsou et al. | 257/98 |
| 2002/0176475 A1 * | 11/2002 | Sai et al. | 372/96 |
| 2005/0073846 A1 * | 4/2005 | Takine | 362/296 |
| 2005/0116235 A1 * | 6/2005 | Schultz et al. | 257/79 |
| 2005/0156162 A1 * | 7/2005 | Kim et al. | 257/40 |

* cited by examiner

*Primary Examiner*—Leonardo Andújar
*Assistant Examiner*—Jordan Klein
(74) *Attorney, Agent, or Firm*—Birch Stewart Kolasch & Birch LLP

(57) ABSTRACT

A light emitting apparatus includes a substrate, a first metal layer, an insulating layer and at least one light emitting device. The first metal layer is disposed on the substrate. The insulating layer is disposed on the first metal layer. The light emitting device is disposed on the insulating layer.

12 Claims, 5 Drawing Sheets

LIGHT EMITTING APPARATUS

CROSS REFERENCE TO RELATED APPLICATIONS

This Non-provisional application claims priority under 35 U.S.C. §119(a) on Patent Application No(s). 095115254 filed in Taiwan, Republic of China on Apr. 28, 2006, the entire contents of which are hereby incorporated by reference.

BACKGROUND OF THE INVENTION

1. Field of Invention

The invention relates to a light emitting apparatus and in particular, to a light emitting apparatus having good heat dissipating efficiency.

2. Related Art

With the development of the optoelectronic industry, light emitting devices, such as LEDs (Light Emitting Diodes), have been widely and variously applied to display functions of electronic products.

Referring to FIG. 1, a conventional LED light emitting apparatus 1 includes a substrate 10, an insulating layer 11, a plurality of light emitting devices 12, a metal layer 13 and a package layer 14. The insulating layer 11 is disposed on the substrate 10. The light emitting devices 12, which are light emitting diodes (LEDs), are disposed on the insulating layer 11. The metal layer 13 is disposed on the insulating layer 11 and electrically connected to the light emitting devices 12 by wire bonding. The package layer 14 encapsulates the light emitting devices 12 to protect them from being influenced and damaged by mechanical factors, heat, moisture or other factors.

With the development of ever higher efficiency and ever higher luminance of the light emitting apparatus 1, the light emitting device 12 generates heat while operating, and the accumulated heat raises the temperature, influencing the light emitting efficiency and the lifetime of the light emitting device 12. However, the conventional light emitting device 12 is disposed on the insulating layer 11 with a poor heat dissipating property, and the heat generated by the light emitting device 12 can not be dissipated easily due to the airtight seal of the package layer 14. Thus, the heat dissipating problem becomes increasingly significant.

To solve the above mentioned problem, the conventional light emitting apparatus 1 usually adopts the substrate 10 that is made of ceramic, copper, copper alloy or thermal conductive material. In addition, the insulating layer 11 is connected to the substrate 10 by thermal conductive adhesive. However, the heat dissipating efficiency will be affected by the thermal resistance caused by the insufficient thermal conductivity of the adhesive. Moreover, the degrading adhesive may also shorten the lifetime of the light emitting apparatus 1.

Therefore, it is an important subject to provide a light emitting apparatus, which has enhanced heat dissipating efficiency and good product reliability.

SUMMARY OF THE INVENTION

In view of the foregoing, the invention is to provide a light emitting apparatus, which has enhanced heat dissipating efficiency and good product reliability.

To achieve the above, the invention discloses a light emitting apparatus which includes a substrate, a first metal layer, an insulating layer and at least one light emitting device. The first metal layer is disposed on the substrate, and the insulating layer is disposed on the first metal layer. The light emitting device is disposed on the first insulating layer.

To achieve the above, the invention also discloses a light emitting apparatus which includes a substrate, a first metal layer, an insulating layer and at least one light emitting device. The first metal layer is disposed on the substrate, and the insulating layer is disposed on the first metal layer. The insulating layer has a patterned area for exposing at least a portion of the substrate. The light emitting device is disposed on the first metal layer and located in the patterned area.

To achieve the above, the invention further discloses a light emitting apparatus which includes a substrate, a first metal layer, an insulating layer and at least one light emitting device. The first metal layer is disposed on the substrate. The first metal layer has a patterned area for exposing at least a portion of the substrate. The insulating layer is disposed on the first metal layer. The light emitting device is disposed on the substrate and located in the patterned area.

As mentioned above, the light emitting apparatus of the invention has a first metal layer and an insulating layer disposed on the substrate sequentially so the heat generated by the light emitting device can be dissipated through the substrate or the first metal layer. Compared with the prior art, the light emitting apparatus according to the invention processes the first metal layer to form the insulating layer with superior thermal conductivity. Therefore, it is possible to enhance the heat dissipating efficiency and avoid the thermal conductive adhesive, and thus the reliability of the product will not be affected by the degraded thermal conductive adhesive.

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
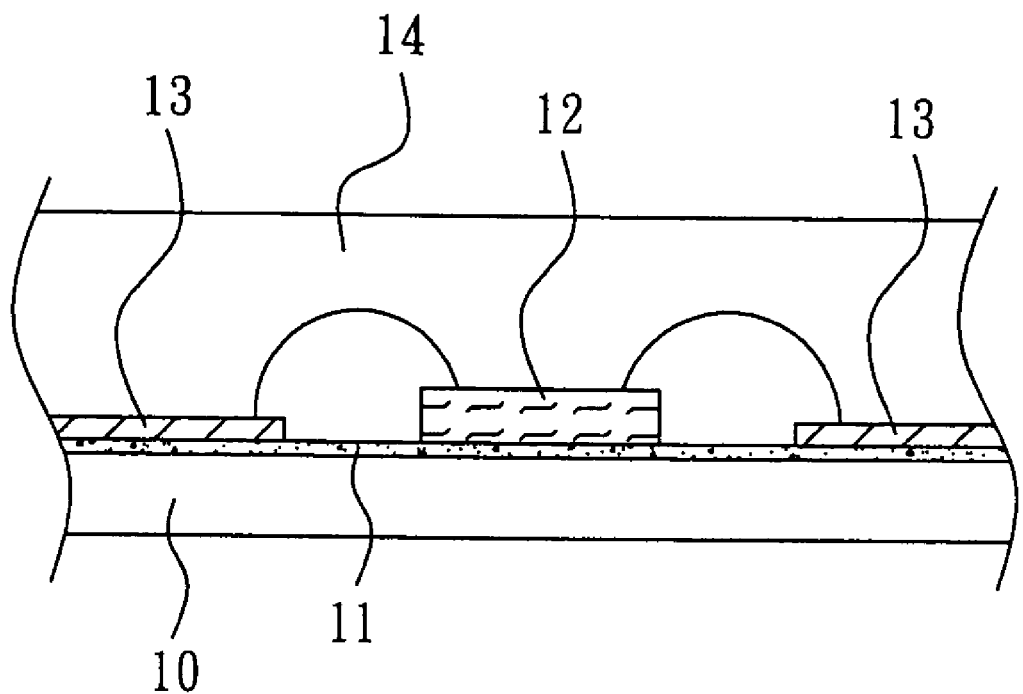
FIG. 1 is a schematic illustration showing a conventional LED light emitting apparatus.
Figure 2:
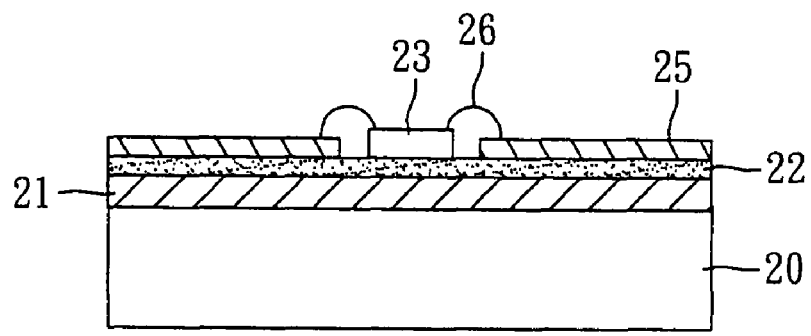
FIGS. 2 to 9 are schematic illustrations showing light emitting apparatuses according to various embodiments of the invention.

Referring to FIG. 2, a light emitting apparatus 2 according to a first embodiment of the invention includes a substrate 20, a metal layer 21, an insulating layer 22 and at least one light emitting device 23.

In this embodiment, the substrate 20 can be a rigid substrate or a flexible substrate. The material of the substrate 20 is composed of the material with good thermal conductivity, such as, but not limited to, copper and alloy thereof, for providing proper heat dissipating efficiency. Because the volume of the substrate 20 is basically much greater than that of the first metal layer 21 and the light emitting device 23 so that the substrate 20 can provide good heat dissipating effect.

The first metal layer 21 of the light emitting apparatus 2 is disposed on the substrate 20. In the embodiment, the first metal layer 21 can be formed on the substrate 20 by physical or chemical method such as evaporating, sputtering, electroplating, thermal spraying or CVD (Chemical Vapor Deposition). The material of the first metal layer 21 is ceramic metal with high thermal conductivity, such as, but not limited to, aluminum, magnesium, titanium and alloys thereof.

The insulating layer 22 is disposed on the first metal layer 21. In the embodiment, the insulating layer 22 is formed by processing the surface of the first metal layer 21. For example, when the first metal layer 21 containing aluminum, magnesium or titanium is processed by oxidizing, nitridizing or carbidizing, the surface of the first metal layer 21 will generate a layer of aluminum oxide, magnesium oxide, titanium oxide, aluminum nitride, magnesium nitride, titanium nitride, aluminum carbide, magnesium carbide or titanium carbide, which formed the ceramic insulating layer 22. In this case, the thickness of the insulating layer 22 is ranged from 100 nm to 1 mm.

The light emitting device 23 is disposed on the insulating layer 22. In this embodiment, the light emitting device 23 can be an LED (Light Emitting Diode), an LD (Laser Diode) or an OLED (Organic Light Emitter Diode).

The light emitting apparatus 2 of this embodiment further includes a second metal layer 25 disposed on the insulating layer 22. The second metal layer 25 is electrically connected to the light emitting device 23 through at least one wire 26. The material of the second metal layer 25 can be selected from at least one of the group consisting of silver, gold, copper, aluminum, chromium and alloys thereof. In addition, the second metal layer 25 can be made of thermal conductive adhesive containing copper, silver and/or tin. The light emitting device 23 and the second metal layer 25 can be electrically connected to each other by wire bonding, adhering with an electrical conductive adhesive or welding. The connecting method can be chosen due to the various types of light emitting device 23.

Figure 3:
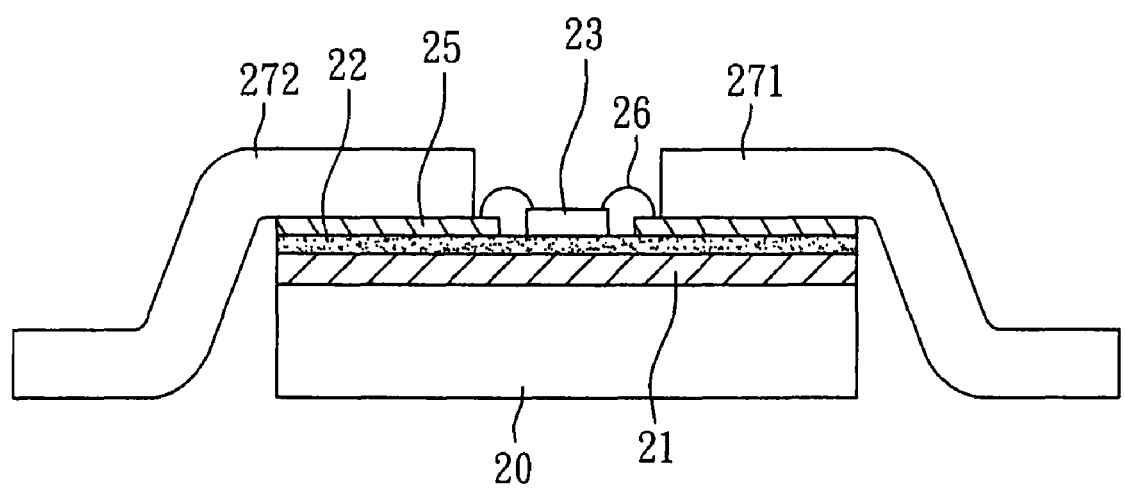

As shown in FIG. 3, a light emitting apparatus 2A according to the invention further includes a lead frame disposed on the insulating layer 22 or the second metal layer 25. The lead flame has a first electrode 271 and a second electrode 272, which are respectively connected to the first electrode and the second electrode of the light emitting device 23. The light emitting device 23 can be electrically connected to an external circuit through the lead frame and thus the light emitting device 23 can be driven to emitting light.

Figure 4:
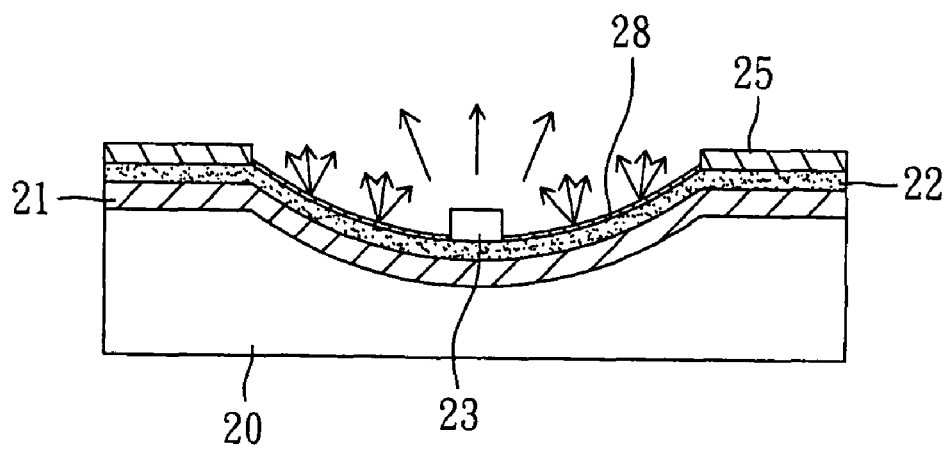

As shown in FIG. 4, a light emitting apparatus 2B according to the invention further includes a recess on the substrate 20, and the light emitting device 23 is disposed in the recess. In this embodiment, the recess can enhance the effect for concentrating the literal light of the light emitting device 23. In addition, the light emitting device 2B can further include a reflective layer 28, which abuts on the light emitting device 23 and is disposed on the insulating layer 22. The reflective layer 28 can reflect the literal light of the light emitting device 23 toward a display direction. The material of the reflective layer 28 can be silver, gold, nickel or aluminum.

Figure 5:
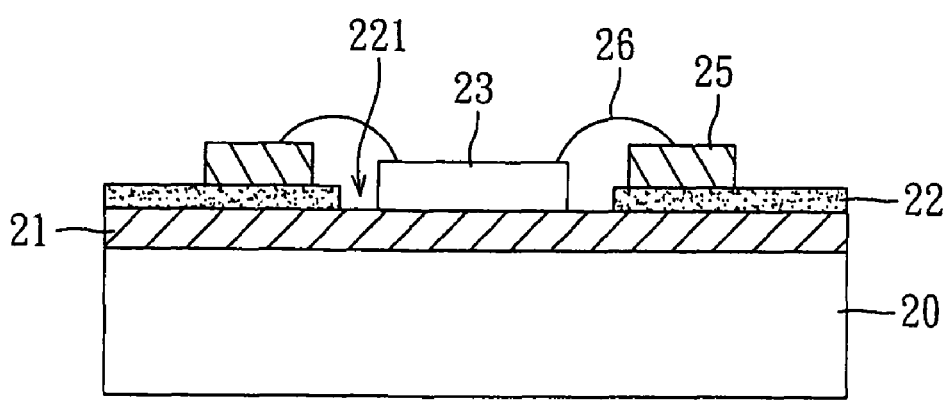

Referring to FIG. 5, a light emitting apparatus 3 according to the invention includes a substrate 20, a first metal layer 21, an insulating layer 22 and at least one light emitting device 23. The configurations, formations, materials, structures and functions of the substrate 20, first metal layer 21, insulating layer 22 and light emitting device 23 are the same as those described hereinabove so that the detailed descriptions are omitted.

In the embodiment, the insulating layer 22 disposed on the first metal layer 21 has a patterned area 221 for exposing at least a portion of the first metal layer 21. The patterned area 221 can be formed by processing the insulating layer 22 by photolithography or screen printing process. The light emitting device 23 is located within the patterned area 221 and is disposed on the first metal layer 21. Herein, the light emitting device 23 can directly contact the first metal layer 21 so that the heat generated by the light emitting device 23 can be conducted and dissipated by the metal material with good thermal conductivity. Therefore, the desired heat dissipating efficiency can be achieved.

Figure 6:
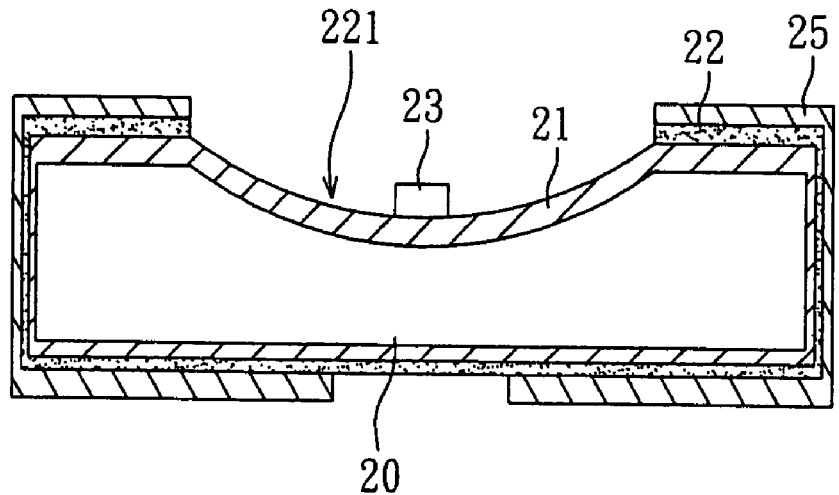

As shown in FIG. 6, in a light emitting apparatus 3A, the first metal layer 21 can completely cover the substrate 20. In the embodiment, the surface of the first metal layer 21 can be processed to generated the insulating layer 22 disposed on the first metal layer 21. That is, the insulating layer 22 covers the surface of the first metal layer 21 and exposes at least a portion of the first metal layer 21 opposite to the patterned area 221. The second metal layer 25 is disposed on the opposite sides of the substrate 20, and the opposite parts of the second metal layer 25 can electrically connect to each other with through holes of the substrate 20 or by edge connection. In addition, the second metal layer 25 can electrically connect to an external circuit directly by way of SMT (Surface Mount Technology).

Figure 7:
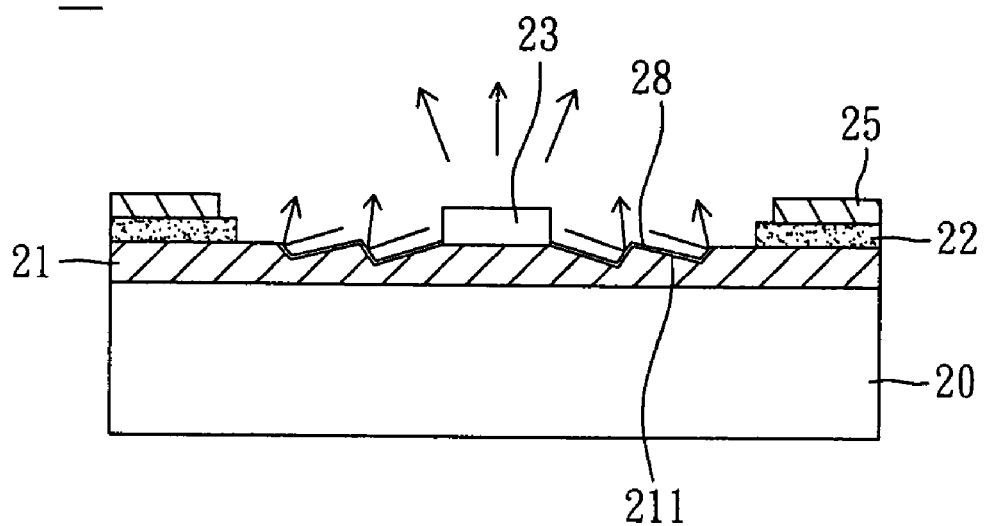

Referring to FIG. 7, in a light emitting apparatus 3B, the first metal layer 21 has a structure 211 for increasing the light emitting efficiency located corresponding to the patterned area 221. The structure 211 can reflect and concentrate the literal light outputted from the light emitting device 23. In the embodiment, the structure 211 for increasing the light emitting efficiency is a rugged structure, which is waveform-shaped or crepe-shaped. Alternatively, the structure 211 for increasing the light emitting efficiency may have a plurality of protrusions (not shown). The cross-section of the protrusions is, for example but not limited to, polygonal, half-circular, circular or elliptic. In this structure, the literal light outputted from the light emitting device 23 can be converged and emitted toward a display direction.

In addition, the light emitting apparatus 3B further includes a reflective layer 28 abutting on the light emitting device 23. The reflective layer 28 can be disposed on the first metal layer 21 or on the structure 211 for enhancing the reflection and convergence of the lateral light of the light emitting device 23. The material of the reflective layer 28 can be silver, gold, nickel or aluminum.

Figure 8:
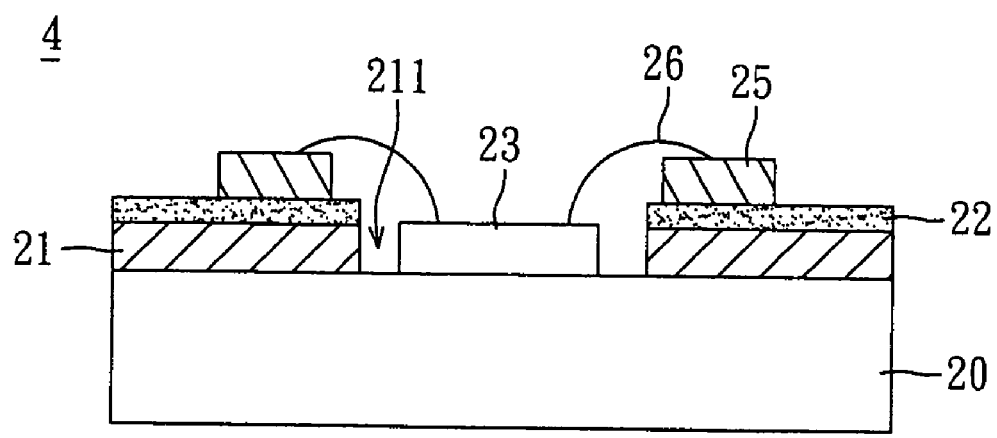

Referring to FIG. 8, a light emitting apparatus 4 according to the invention includes a substrate 20, a first metal layer 21, an insulating layer 22 and at least one light emitting device 23. The configurations, formations, materials, structures and functions of the substrate 20, first metal layer 21, insulating layer 22 and light emitting device 23 are the same as those described hereinabove so that the detailed descriptions are omitted.

In the embodiment, the first metal layer 21 disposed on the substrate 20 has a patterned area 212 for exposing at least a portion of the substrate 20. The light emitting device 23 is located within the patterned area 212 and is disposed on the substrate 20. Herein, the light emitting device 23 can directly contact the substrate 20, which has good thermal conductivity, so that the desired heat dissipating efficiency can be achieved.

Figure 9:
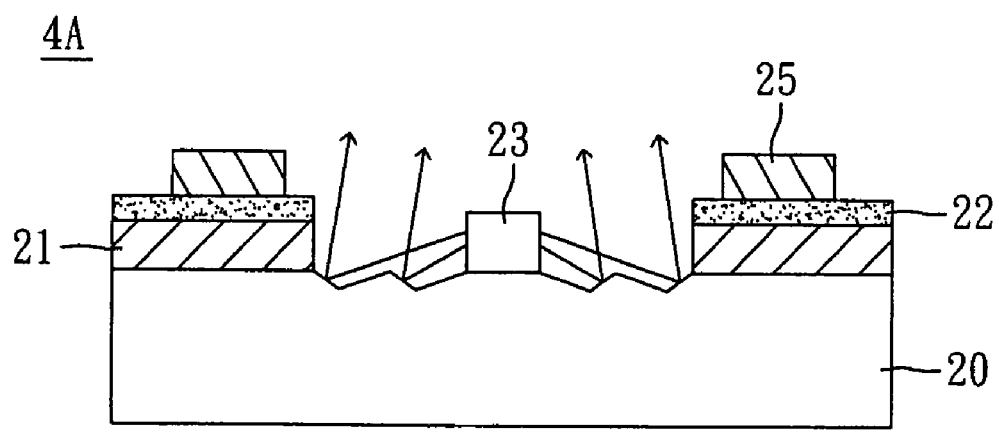

Referring to FIG. 9, in a light emitting apparatus 4A, the substrate 20 has a structure 201 for increasing the light emitting efficiency located corresponding to the patterned area 212. The structure 201 can reflect and concentrate the literal light outputted from the light emitting device 23. In the embodiment, the structure 201 for increasing the light emitting efficiency is a rugged structure or has a plurality of protrusions. Because, the type and shape of the rugged structure or protrusions are described in the previous embodiment, the detailed descriptions are omitted.

In summary, the light emitting apparatus of the invention has a first metal layer and an insulating layer disposed on the substrate in order, so the heat generated by the light emitting device can be dissipated through the substrate or first metal layer. Compared with the prior art, the invention processes the first metal layer to form the insulating layer with superior thermal conductivity. So, it is possible to enhance the heat dissipating efficiency and avoid the thermal conductive adhesive. Therefore, the reliability of the product will not be affected by the degraded thermal conductive adhesive.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A light emitting apparatus comprising:
   a substrate;
   a first metal layer directly disposed on the substrate;
   an insulating layer disposed on the first metal layer;
   at least one light emitting device disposed on and in direct contact with the insulating layer; and
   a second metal layer disposed on the insulating layer, and electrically connected with the light emitting device through at least one wire by wire bonding, an electrical conductive adhesive or welding.

2. The light emitting apparatus according to claim 1, further comprising a lead frame disposed on the insulating layer or the second metal layer, and having a first electrode and a second electrode, both of which are electrically connected to the light emitting device.

3. The light emitting apparatus according to claim 1, wherein the substrate has a recess, and the light emitting device is disposed corresponding to the recess.

4. The light emitting apparatus according to claim 1, further comprising a reflective layer disposed adjacent to the light emitting device, wherein the reflective layer and the light emitting device are formed on the insulating layer.

5. The light emitting apparatus according to claim 4, wherein the reflective layer is made of silver, gold, nickel, or aluminum.

6. The light emitting apparatus according to claim 1, wherein the insulating layer is formed by oxidizing, nitridizing or carbidizing a surface of the first metal layer, and the insulating layer is made of oxide, nitride, or carbide of aluminum, magnesium, or titanium, or ceramic.

7. The light emitting apparatus according to claim 1, wherein the substrate is made of copper, copper alloy or thermal conductive material.

8. The light emitting apparatus according to claim 1, wherein the substrate is a rigid substrate or a flexible substrate.

9. The light emitting apparatus according to claim 1, wherein the first metal layer is made of aluminum, magnesium, titanium, and their alloys, or ceramic metal with high thermal conductivity.

10. The light emitting apparatus according to claim 1, wherein the thickness of the insulating layer is ranged from 100 nm to 1 nm.

11. The light emitting apparatus according to claim 1, wherein the insulating layer is made of ceramic.

12. The light emitting apparatus according to claim 1, wherein the second metal layer is selected from at least one of the group consisting of silver, gold, copper, aluminum, chromium, and their alloys.

* * * * *